(12) United States Patent  (10) Patent No.: US 8,518,591 B2
Hotta  (45) Date of Patent: Aug. 27, 2013

(54) TERMINAL DEVICE FOR CELL VOLTAGE MEASUREMENT OF A FUEL CELL

(75) Inventor: Yutaka Hotta, Toyota (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 0 days.

(21) Appl. No.: 13/388,016

(22) PCT Filed: Apr. 20, 2010

(86) PCT No.: PCT/JP2010/002834
§ 371 (c)(1),
(2), (4) Date: Jan. 30, 2012

(87) PCT Pub. No.: WO2011/132216
PCT Pub. Date: Oct. 27, 2011

(65) Prior Publication Data
US 2012/0129069 A1    May 24, 2012

(51) Int. Cl.
*H01M 8/04*    (2006.01)
(52) U.S. Cl.
USPC .................................. 429/432; 324/76.11
(58) Field of Classification Search
USPC ............... 429/400–535; 324/76.11
See application file for complete search history.

(56) References Cited

FOREIGN PATENT DOCUMENTS

| JP | 2001-256991 A | 9/2001 |
| JP | 2001-256992 A | 9/2001 |
| JP | 2002-358993 A | 12/2002 |
| JP | 2002-367649 A | 12/2002 |
| JP | 2003-086205 A | 3/2003 |
| JP | 2003-123816 A | 4/2003 |
| JP | 2004-079195 A | 3/2004 |
| JP | 2004-362860 A | 12/2004 |
| JP | 2005-310753 A | 11/2005 |
| JP | 2007-265674 A | 10/2007 |
| JP | 2009-187677 A | 8/2009 |

OTHER PUBLICATIONS

International Search Report issued Jul. 6, 2010 in PCT/JP2010/002834.

*Primary Examiner* — Basia Ridley
*Assistant Examiner* — James Lee
(74) *Attorney, Agent, or Firm* — Kenyon & Kenyon LLP

(57) ABSTRACT

A terminal device for cell voltage measurement of a fuel cell having a plurality of cells includes a plurality of terminals, a support member and a fixing member. The plurality of terminals each includes a conductive columnar part, and are electrically connected to the cells by the columnar part of each of the terminals being in contact with a conductive terminal contact part of a different cell of the fuel cell. The support member supports the terminals so that center axes of the columnar parts of the terminals are parallel to each other, and so that the center axes are aligned in one row at fixed intervals. The fixing member supports the support member so as to be able to rotate around a specified rotation shaft that is parallel to the center axes, and is attached to the fuel cell.

8 Claims, 7 Drawing Sheets

TERMINAL DEVICE FOR CELL VOLTAGE MEASUREMENT OF A FUEL CELL

This is a 371 national phase application of PCT/JP2010/002834 filed 20 Apr. 2010, the contents of which are incorporated herein by reference.

TECHNICAL FIELD

The present invention relates to a terminal device for cell voltage measurement of a fuel cell.

BACKGROUND ART

For example with a polymer electrolyte fuel cell, the voltage of each cell is measured (observed) to confirm that normal power generation is being performed with each cell, or to perform flow control of the reaction gases (fuel gas and oxidant gas). When measuring cell voltage, the terminals electrically connected to each cell of the fuel cell are used.

A terminal device (terminal unit) having a plurality of terminals corresponding to a plurality of cells is known for measuring cell voltage for a plurality of cells of a fuel cell.

SUMMARY

With fuel cells, there are cases when the desired characteristics differ according to the application, for example. Because of that, there are cases when the specifications of the electrolyte membrane or the catalyst layer constituting the cells differ for each fuel cell, and as a result, there are cases when the cell thickness differs for each fuel cell.

Conventional terminal devices having a plurality of terminals have the intervals between terminals set in a fixed manner, so it is difficult to use these in common for a plurality of types of fuel cells with mutually different cell thicknesses. Because of that, it is necessary to prepare a plurality of types of terminal devices for which the intervals between terminals correspond to the cell thickness of the various types of fuel cells.

Note that this kind of problem is not limited to polymer electrolyte fuel cells, but is a problem common to cell voltage measurement terminal devices for fuel cells containing a plurality of cells.

By taking into account at least part of the problems noted above, there is a requirement for providing a terminal device for cell voltage measurement that can be used in common for a plurality of types of fuel cells with mutually different cell thicknesses.

In order to address at least part of the requirement noted above, the present invention provides various aspects and applications described below.

[Aspect 1] A terminal device for cell voltage measurement of a fuel cell having a plurality of cells, the terminal device comprising:

a plurality of terminals each including a conductive columnar part, the terminals being electrically connected to the cells by the columnar part of each of the terminals being in contact with a conductive terminal contact part of a different cell of the fuel cell;

a support member that supports the terminals so that center axes of the columnar parts of the terminals are parallel to each other, and so that the center axes are aligned in one row at fixed intervals; and a fixing member that supports the support member so as to be able to rotate around a specified rotation shaft that is parallel to the center axes, the fixing member being attached to the fuel cell.

With this terminal device, by rotating the support member, the terminals supported by the support member are rotated while maintaining a state that the center axes of the columnar parts are parallel to each other and aligned in one row at fixed intervals. By this rotation, it is possible to vary the distance between the terminals along the stacking direction of the fuel cells in a state with the fixing member attached to the fuel cell. Therefore, this terminal device can be used in common for a plurality of types of fuel cells with mutually different cell thicknesses.

[Aspect 2] The terminal device in accordance with the aspect 1, wherein at least a portion of a periphery of each of the columnar parts in a cross section orthogonal to the center axis is an arc shape.

With this terminal device, even when the terminals are rotated by rotating the support member, it is possible to have reliable contact between the columnar part of each terminal and the terminal contact part of the fuel cell, so even when used in common for a plurality of types of fuel cells with mutually different cell thicknesses, it is possible to reliably measure the cell voltage of the fuel cell.

[Aspect 3] The terminal device in accordance with either one of the aspects 1 and 2, wherein each of the terminals includes at an end part on a side opposite to a side supported by the support member a large diameter part, a diameter of the large diameter part in a cross section orthogonal to the center axis being larger than a diameter of the columnar part in a cross section orthogonal to the center axis.

With this terminal device, the large diameter part functions as a retainer for each terminal, so it is possible to inhibit the terminals from being separated from the terminal contact parts of the fuel cell and making measurement of the cell voltage impossible.

[Aspect 4] The terminal device in accordance with any one of the aspects 1 through 3, wherein length of two of the terminals among the plurality of terminals along a direction toward a side opposite to a side supported by the support member is longer than the other terminals.

With this terminal device, it becomes easier to set the angle of the support member when having each terminal contact the terminal contact part, and it is possible to improve the workability of attaching to the fuel cell of the terminal device.

[Aspect 5] The terminal device in accordance with any one of the aspects 1 through 4, wherein the terminal contact part of each of the cells of the fuel cell has a contact plane orthogonal to a stacking direction of the fuel cell, and each of the terminals is electrically connected to the cell by contact of a side surface of the columnar part with the contact plane of the terminal contact part.

With this terminal device, each terminal is electrically connected with each cell by contact of the side surface of the columnar part with the contact plane of the terminal contact part, so it is possible to have reliable contact of the columnar part of each terminal with the terminal contact part even when rotating each terminal by rotating the support member, and it is possible to reliably measure the cell voltage of fuel cells even when using in common for a plurality of types of fuel cells of mutually different cell thicknesses.

[Aspect 6] The terminal device in accordance with the aspect 5, wherein the terminal contact part is constituted by one set of separators of each of the cells of the fuel cell, and the terminal contact part has at an outside from the contact plane a tapered part constituted by the one set of separators for which a mutual intervals become larger further to the outside.

With this terminal device, because it is possible to easily insert each of the terminals between one set of separators constituting the terminal contact part, it is possible to improve the workability of attaching to the fuel cell of the terminal device.

[Aspect 7] The terminal device in accordance with either one of the aspects 5 and 6, wherein the rotation shaft is positioned at an equal distance from the center axes of the two terminals positioned furthest to the outside among the plurality of terminals.

With this terminal device, it is possible to lessen the maximum degree of variation of the position of each of the terminals along the direction orthogonal to the fuel cell attacking direction that accompanies the rotation of the support member, so it is possible to make the width of the contact plane of the terminal contact part of each cell small.

Note that the present invention can be realized with various aspects, and it is possible to realize, for example, aspects such as a terminal device for measuring cell voltage, a fuel cell having the concerned terminal device, a fuel cell system having the concerned fuel cell, a moving body (vehicle) having the concerned fuel cell system or the like.

DESCRIPTION OF THE EMBODIMENTS

A. First Embodiment

Figure 1:
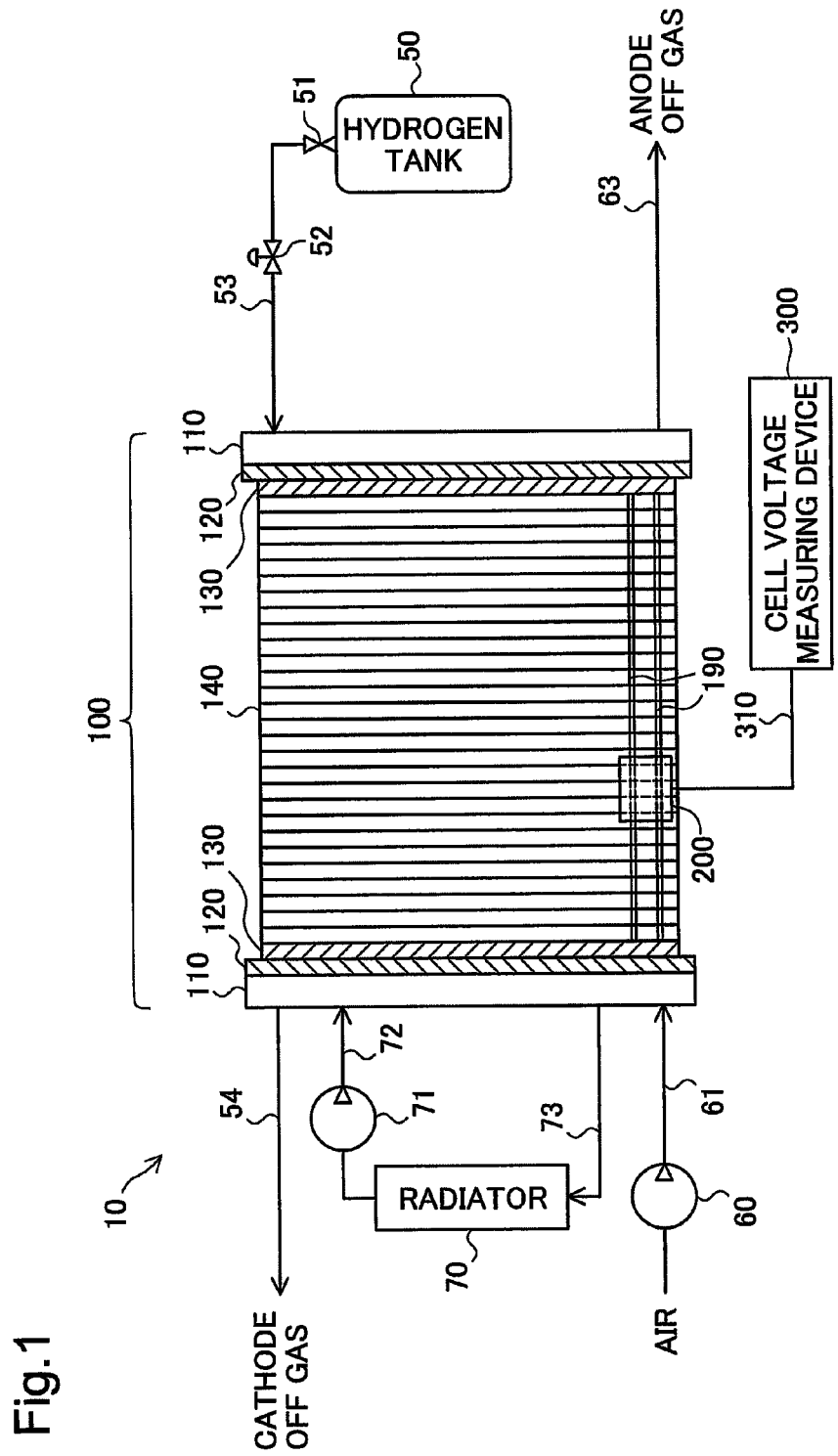
FIG. 1 is an explanatory drawing showing the schematic structure of a fuel cell system 10 of a first embodiment of the present invention.

FIG. 1 is an explanatory drawing showing the schematic structure of a fuel cell system 10 of a first embodiment of the present invention. The fuel cell system 10 includes a fuel cell 100. The fuel cell 100 has a stacked constitution for which an end plate 110, an insulation plate 120, a collector plate 130, a plurality of cells 140, a collector plate 130, an insulation plate 120, and an end plate 110 are stacked in this order.

The fuel cell 100 of this embodiment is a polymer electrolyte fuel cell. Each cell 140 of the fuel cell 100 has a constitution for which a power generating module 150 including a membrane electrode assembly (also called "MEA") for which an anode side catalyst layer and a cathode side catalyst layer are respectively arranged at both surfaces of an electrolyte membrane is held by a pair of separators (cathode side separator 160 and anode side separator 170) (see FIG. 2). The electrolyte membrane is an ion exchange membrane formed by a solid polymer material such as a fluorine resin equipped with a perfluorocarbon sulfonate, and has good proton conductivity in a humid state. The catalyst layer includes platinum as a catalyst supported on carbon particles and an electrolytic material (ionomer). The separator is formed using a conductive material such as metal or carbon, for example. Note that the power generating module 150 may include a pair of gas diffusion layers that are formed by carbon paper or carbon cloth, for example and are arranged so as to sandwich the MEA.

As shown in FIG. 1, hydrogen is supplied as the fuel gas to the fuel cell 100 from a hydrogen tank 50 in which high pressure hydrogen is stored via a shut valve 51, a regulator 52, and piping 53. The fuel gas supplied to the fuel cell 100 is distributed to each cell 140 via a fuel gas supply manifold (not illustrated), and is used for power generation at each cell 140. Residual fuel gas that is not consumed by the power generation at each cell 140 (anode off gas) is consolidated via a fuel gas exhaust manifold (not illustrated), and is exhausted to outside the fuel cell 100 via exhaust piping 63.

Air is supplied as the oxidant gas to the fuel cell 100 via an air pump 60 and piping 61. The oxidant gas supplied to the fuel cell 100 is distributed to each cell 140 via an oxidant gas supply manifold (not illustrated), and is used for power generation at each cell 140. The residual oxidant gas that is not consumed with power generation at each cell 140 (cathode off gas) is consolidated via an oxidant gas exhaust manifold (not illustrated), and is exhausted to outside the fuel cell 100 via the exhaust piping 54.

To cool the fuel cell 100, a cooling medium cooled by a radiator 70 is supplied to the fuel cell 100 via a water pump 71 and piping 72. The cooling medium supplied to the fuel cell 100 is distributed to each cell 140 via a cooling medium supply manifold (not illustrated), and cools each cell 140. After that, the cooling medium is consolidated via a cooling medium exhaust manifold (not illustrated) and exhausted from the fuel cell 100, and is circulated in the radiator 70 via piping 73.

Two terminal attachment convex parts 190 (details described later) extending along the stacking direction of the fuel cell 100 are formed on the outer surface of the fuel cell 100. A terminal unit 200 as a terminal device for cell voltage measurement of each cell 140 of the fuel cell 100 is attached to the terminal attachment convex part 190 of the fuel cell 100. The terminal unit 200 is connected with a cell voltage measurement device 300 that measures cell voltage of each cell 140 of the fuel cell 100 via a cable 310. The cell voltage measurement device 300 calculates the cell voltage of each cell 140 based on the potential value of each cell 140 obtained by the terminal unit 200. The value of the cell voltage of each cell 140 calculated by the cell voltage measurement device 300 is supplied to a control unit (not illustrated) for controlling each part of the fuel cell system 10, and is used for confirmation of normal power generation at each cell 140 by the control unit, reaction gas flow control, and the like.

Figure 2:
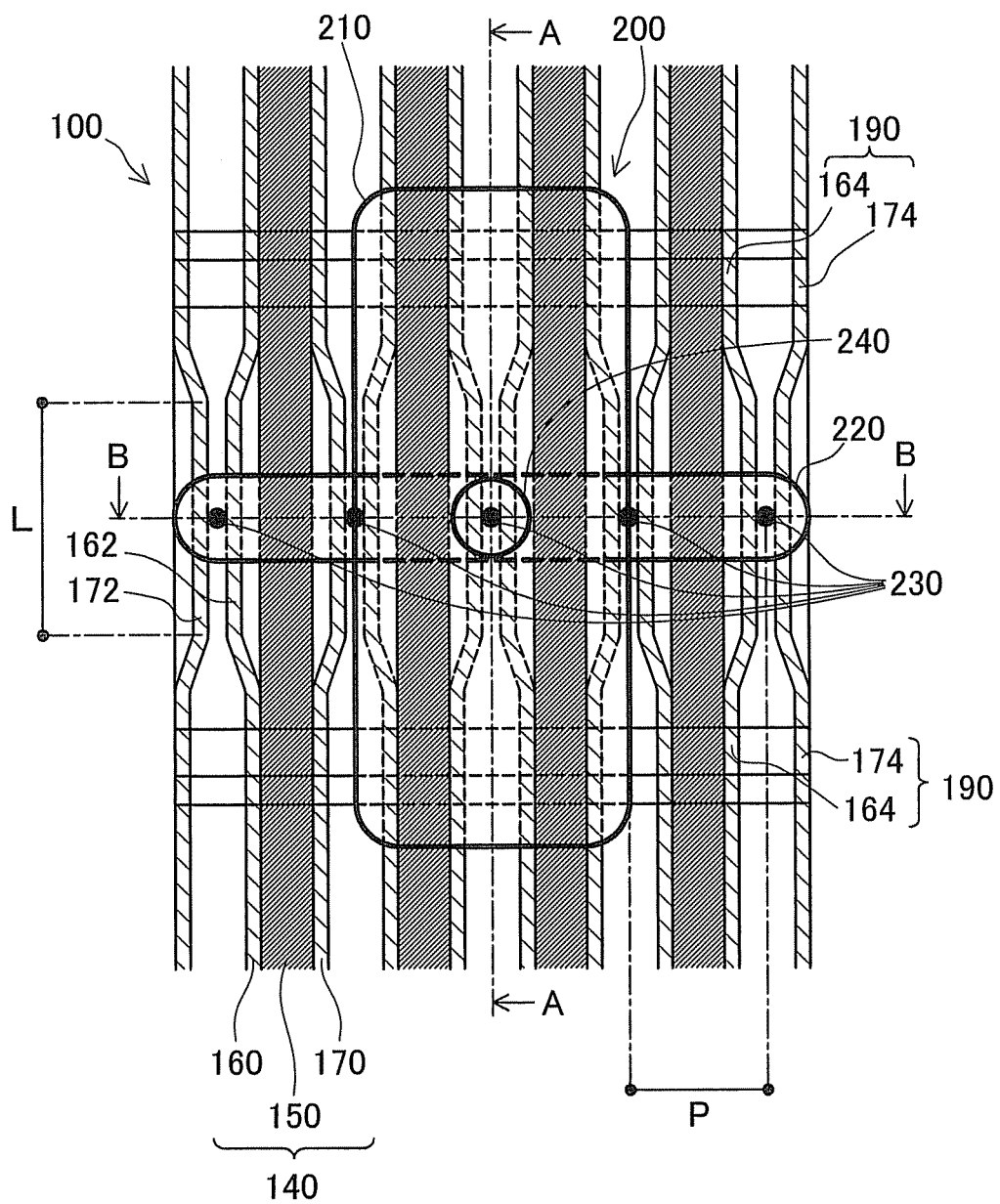
FIG. 2 is an explanatory drawing schematically showing the constitution of the terminal unit 200 of the first embodiment.
Figure 3:
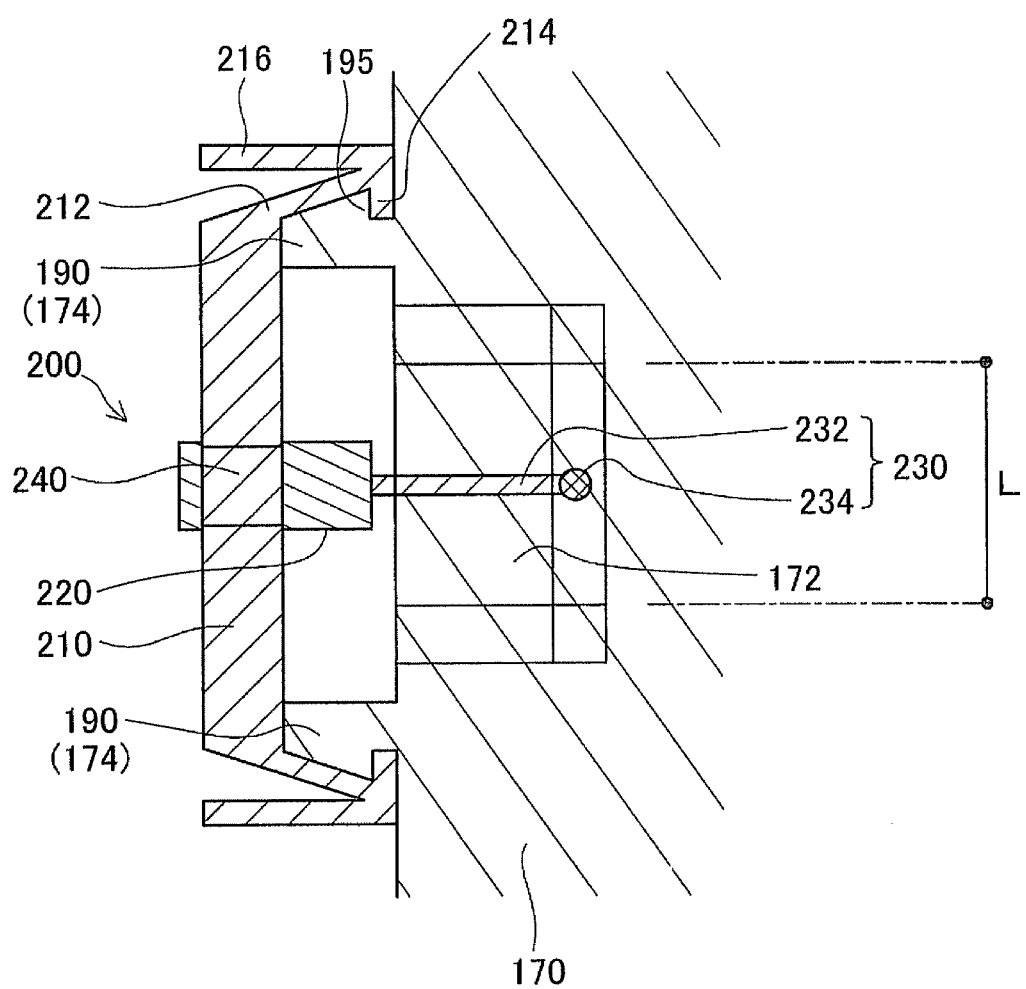
FIG. 3 is an explanatory drawing schematically showing the constitution of the terminal unit 200 of the first embodiment.
Figure 4:
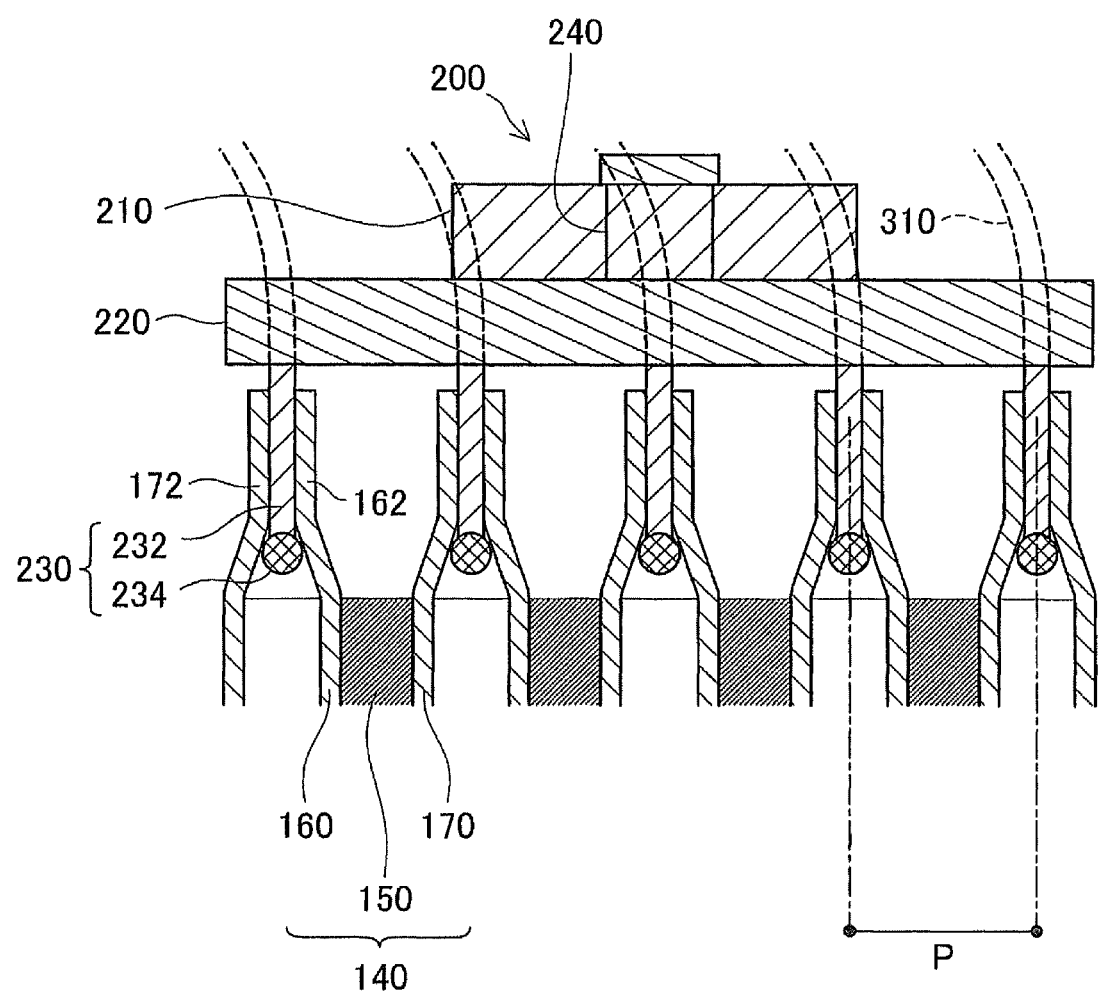
FIG. 4 is an explanatory drawing schematically showing the constitution of the terminal unit 200 of the first embodiment.

FIG. 2 through FIG. 4 are explanatory drawings schematically showing the constitution of the terminal unit 200 of the first embodiment. FIG. 2 shows the planar constitution of the terminal unit 200 in a state with the terminal unit 200 attached to the fuel cell 100, FIG. 3 shows the cross section constitution of the terminal unit 200 at the A-A position of FIG. 2, and FIG. 4 shows the cross section constitution of the terminal unit 200 at the B-B position of FIG. 2.

As shown in the drawings, a planar part (called "anode side contact plane part 172") which projects in the direction toward the adjacent cell 140 (the direction approaching the cathode side separator 160 facing opposite without going via the power generating module 150) and is orthogonal to the stacking direction is formed on the outer periphery part (part not facing opposite the power generating module 150) of the anode side separator 170 of each cell 140 of the fuel cell 100. Similarly, a planar part (called "cathode side contact plane part 162") which projects in the direction toward the adjacent cell 140 (the direction approaching the anode side separator 170 facing opposite without going via the power generating module 150) and is orthogonal to the stacking direction is formed on the outer periphery part of the cathode side separator 160 of each cell 140. The anode side contact plane part 172 and the cathode side contact plane part 162 are formed by press working, for example. As shown in FIG. 2 and FIG. 4, with a set of the anode side contact plane part 172 of one cell 140 and the cathode side contact plane part 162 of the cell 140 adjacent to the concerned one cell 140, specifically, a set of the anode side contact plane part 172 and the cathode side contact plane part 162 facing opposite without going via the power generating module 150 (hereafter also called "terminal contact part"), the mutual interval along the stacking direction is slightly smaller than the diameter of the columnar part 232 of the terminal 230 or is roughly equal to the diameter of the columnar part 232. As shown in FIG. 2 and FIG. 3, the anode side contact plane part 172 and the cathode side contact plane part 162 are positioned between two terminal attachment convex parts 190 and are planes having a specified width L.

The terminal unit 200 of this embodiment includes five terminals 230, a support member 220 supporting the five terminals 230, and a fixing member 210 that supports the support member 220 and is attached to the fuel cell 100.

As shown in FIG. 3 and FIG. 4, each terminal 230 has a columnar part 232 formed using a conductive material (e.g. metal), and is supported on the support member 220 at one end of the columnar part 232. The cross section shape orthogonal to the center axis of each columnar part 232 is circular. Each terminal 230 has a spherical large diameter part 234 with a larger diameter than the cross section diameter of the columnar part 232 at one end (free end) of the opposite side to the other end (support end) supported on the support member 220. A cable 310 for conveying the electric potential of the corresponding cell 140 to the cell voltage measuring device 300 (FIG. 1) is connected near the support end of each terminal 230.

The support member 220 is a member formed using a non-conductive material (e.g. resin material), and supports the five terminals 230 in a fixed manner. More specifically, the support member 220 supports one row of columnar parts 232 of each terminal 230 with the center axes of the columnar parts 232 of each terminal 230 parallel to each other, and so that they are aligned in one row at a fixed interval P. Specifically, the positions of the support ends of each terminal 230 are aligned on one straight line, and the positions of the free ends of each terminal 230 (positions of the large diameter part 234) are also aligned on one straight line.

The fixing member 210 is a member formed using a non-conductive material (e.g. resin material), and the support member 220 is supported to be able to rotate on the shaft part 240. The rotation shaft of the support member 220 at the fixing member 210 is parallel to the center axis of the columnar part 232 of each terminal 230, and with this embodiment, as shown in FIG. 2, is positioned at the center of the center axes of the two terminals 230 positioned furthest to the outside (specifically, it matches with the center axis of the columnar part 232 of the terminal 230 positioned in the middle among the five terminals 230). When the support member 220 rotates around this kind of rotation shaft, the terminals 230 supported on the support member 220 are rotated while maintaining a state that the center axes of the columnar parts 232 are parallel to each other and aligned in one row at a fixed interval P.

The fixing member 210 also has two arm parts 212 for being fixed by attachment to the terminal attachment convex part 190 of the fuel cell 100 near both ends as shown in FIG. 3. Here, the terminal attachment convex part 190 of the fuel cell 100 is constituted by a convex part 174 formed so as to project to the side direction outside at the outer periphery part of the anode side separator 170 of each cell 140 (see FIGS. 2 and 3), or a convex part 164 formed in the same manner on the cathode side separator 160 (see FIG. 2). The terminal attachment convex part 190 has a chin part 195 near its base. The arm part 212 of the fixing member 210 has a chin part 214 near its tip with a shape that matches with the chin part 195 of the terminal attachment convex part 190. By matching the chin part 214 of the arm part 212 and the chin part 195 of the terminal attachment convex part 190, the fixing member 210 is fixed by attachment to the fuel cell 100, and thus, the terminal unit 200 is fixed by attachment to the fuel cell 100. When for example a seal member is arranged further to the outside than the outer periphery of the power generating module 150 of each cell, the same shaped convex part as the convex part 174 of the anode side separator 170 is formed on the concerned seal member as well, and the concerned convex part may be a part of the terminal attachment convex part 190.

With this embodiment, the arm part 212 of the fixing member 210 is elastically deformable. When the fixing member 210 approaches the fuel cell 100, the arm part 212 is elastically deformed to the outside along the tapered shape provided on the outside of the terminal attachment convex part 190, and when the chin part 214 of the arm part 212 reaches the position of the chin part 195 of the terminal attachment convex part 190, the arm part 212 has its elastic deformation disappear and returns to the inside, and the chin part 214 of the arm part 212 and the chin part 195 are matched. Because of this, when attaching the fixing member 210 to the fuel cell 100, a snap sense (click sense) is obtained, and reliable attachment is realized. Also, a grip part 216 connected with the tip part of each arm part 212 is formed at the outside of each arm part 212 of the fixing member 210. By grasping the tips of the grip parts 216 of both sides of the fixing member 210 and applying force inwardly, the tip part of the arm part 212 is deformed to the outside, the matching of the chin part 214 and the chin part 195 is released, and it is possible to easily remove the fixing member 210 from the fuel cell 100.

When attaching the terminal unit 200 to the fuel cell 100, as shown in FIGS. 2 and 4, each terminal 230 is inserted between the anode side contact plane part 172 and the cathode side contact plane part 162 that constitute each terminal contact part. With the examples shown in FIG. 2 and FIG. 4, the thickness of each cell 140 of the fuel cell 100 is roughly the same as the interval P between the terminals 230 of the terminal unit 200, so the intervals between the adjacent terminal contact parts are also roughly the same as the interval P between the terminals 230. In this case, each terminal 230 is inserted in the terminal contact part in a state so that the straight line that connects each of the terminals 230 is parallel to the stacking direction of the fuel cell 100.

Because each terminal 230 has a large diameter part 234 at the free end, there is elastic deformation such that the mutual interval of the anode side contact plate part 172 and the cathode side contact plane part 162 constituting the terminal contact part expands with insertion of each terminal 230. When the large diameter part 234 reaches up to the part for which the inside interval is wider than the anode side contact plane part 172 and the cathode side contact plane part 162, the elastic deformation of the anode side contact plane part 172 and the cathode side contact plane part 162 returns to the original state. As described above, the interval of the anode side contact plane part 172 and the cathode side contact plane part 172 that constitute the terminal contact part is either slightly smaller than the diameter of the columnar part 232 of the terminal 230 or roughly the same as the diameter of the columnar part 232, so in this state, the side surface of the columnar part 232 of each terminal 230 contacts the surface of the anode side contact plane part 172 and the cathode side contact plane part 162, and each of the terminals 230 and each of the cells 140 are in electrical contact. The large diameter part 234 functions as a retainer (a part for avoiding being extracted) of the terminal 230. By the existence of the large diameter part 234, it is possible to inhibit the terminals 230 from being separated from terminal contact part of the fuel cell 100 and the measurement of the cell voltage becoming impossible.

The arm part 212 of the fixing member 210 and the terminal attachment convex part 190 are constituted such that the chin part 214 of the arm part. 212 and the chin part 195 of the terminal attachment convex part 190 match immediately after the large diameter part 234 of each terminal 230 reaches to the inside more than each terminal contact part. Therefore, by the fixing member 210 being attached to the terminal attachment convex part 190 of the fuel cell 100, the terminal unit 200 is fixed to the fuel cell 100 in a state with each terminal 230 and each cell 140 electrically connected, and measurement of the cell voltage of each cell 140 by the cell voltage measuring device 300 becomes possible.

Figure 5:
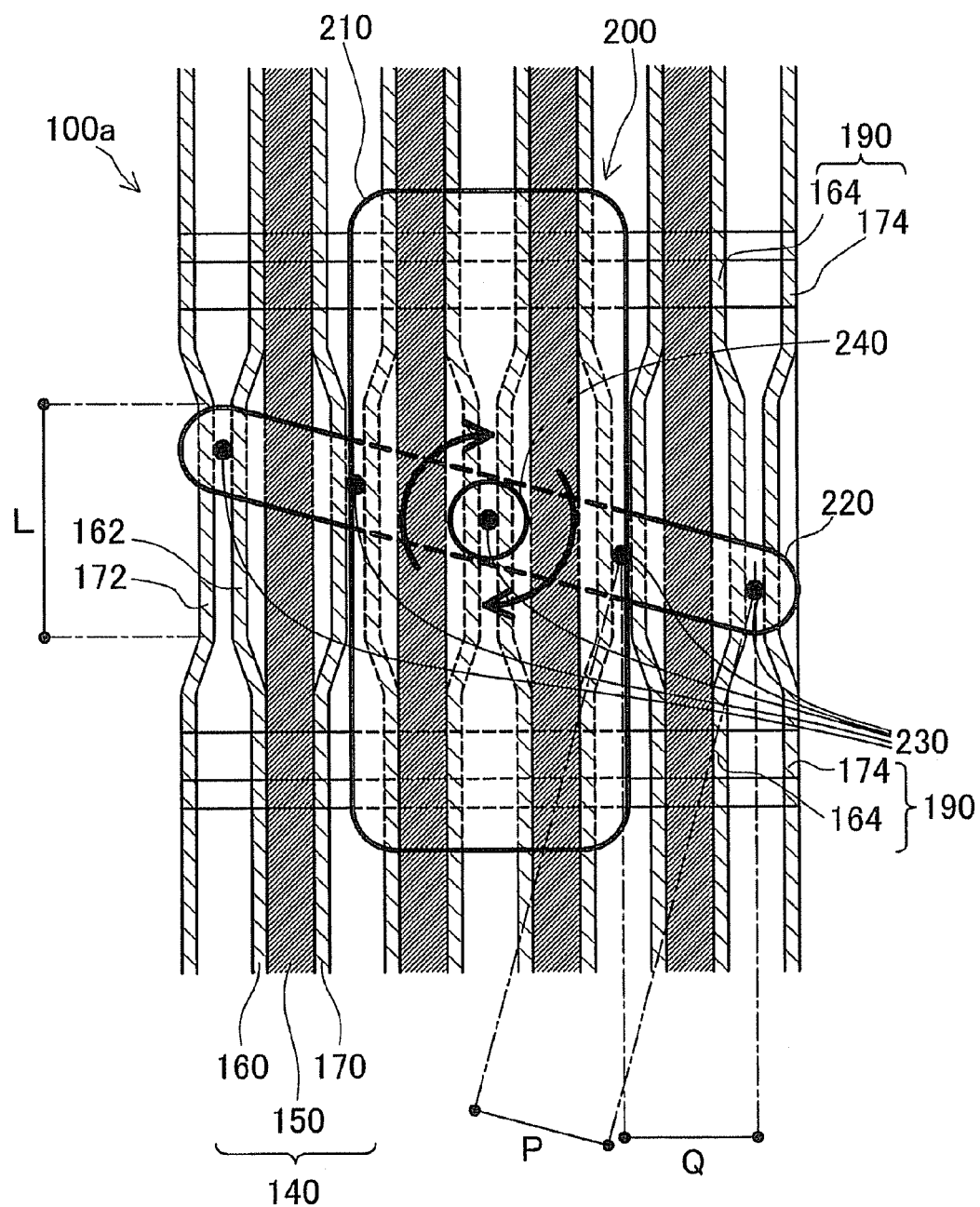
FIG. 5 is an explanatory drawing showing the state of the terminal unit 200 of the first embodiment attached to a different type of fuel cell with a thinner cell thickness.

The terminal unit 200 of the first embodiment can be used in common for various types of fuel cells with different thicknesses of the cells 140. FIG. 5 is an explanatory drawing showing the state of the terminal unit 200 of the first embodiment attached to a different type of fuel cell with a thinner cell thickness. The fuel cell 100a shown in FIG. 5 has a thinner thickness of the cell 140 than the fuel cell 100 described above, so the interval between adjacent terminal contact parts is smaller. In this case, as shown in FIG. 5, by rotating the support member 220, each terminal 230 supported by the support member 220 is also rotated, and in a state for which the straight line connecting each terminal 230 is not parallel with the stacking direction of the fuel cell 100a, each terminal 230 is inserted between the anode side contact plane part 172 and the cathode side contact plane part 162 that constitute the terminal contact part. If the straight line connecting each terminal 230 is in a state not parallel with the stacking direction of the fuel cell 100a, the distance Q between the terminals 230 along the stacking direction is smaller than the actual interval P between each terminal 230. Because of this, even for a fuel cell 100a for which the cell 140 thickness is thinner, it is possible to attach the terminal unit 200 so as to have each terminal 230 inserted in each terminal contact part and be in mutual contact. Also, because the cross section shape orthogonal to the center axis of the columnar part 232 of each terminal 230 is circular, even in a state when the support member 220 is rotated and the straight line connecting each terminal 230 is not parallel to the stacking direction of the fuel cell 100a, it is possible to have reliable contact of the columnar part 232 of each terminal 230 with the terminal contact part of each cell 140. In this way, the terminal unit 200 of this embodiment can be used in common for various types of fuel cells of mutually different cell thicknesses, so it is possible to increase shared use of parts and to reduce costs.

B. Modifications

The present invention is not limited to the embodiments and the aspects noted above, and it may be actualized in diversity of other embodiments and applications within the scope of the invention, and for example the following modifications are possible.

Figure 6:
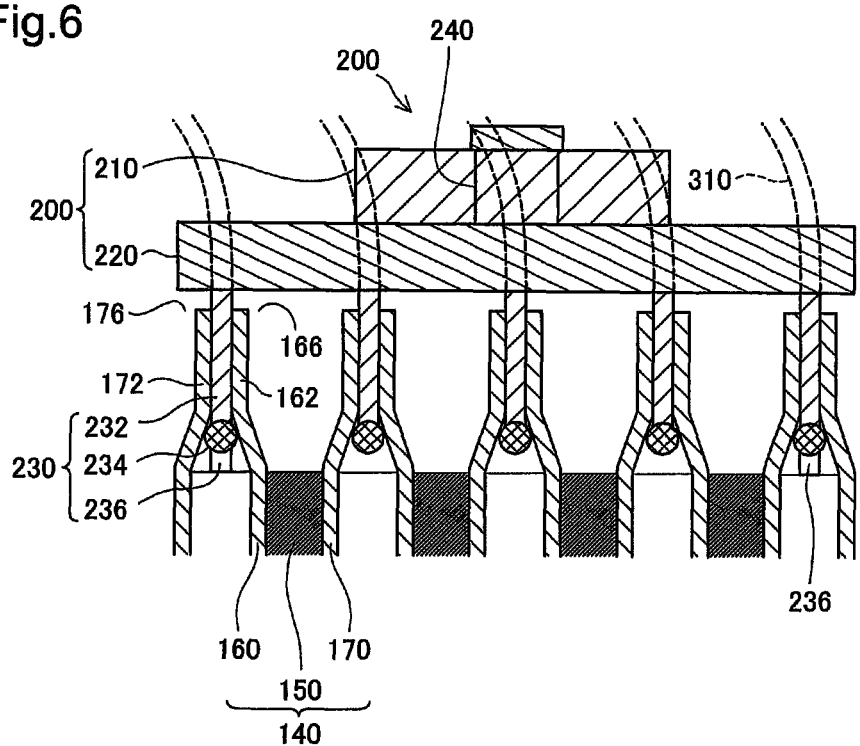
FIG. 6 is an explanatory drawing showing the connected state of the terminal unit 200 and each cell 140 in a modification.

FIG. 6 is an explanatory drawing showing the connected state of the terminal unit 200 and each cell 140 in a modification. With the modification shown in FIG. 6, the two terminals positioned furthest to the outside among the plurality of terminals 230 of the terminal unit 200 have a convex part 236 at the outside of the large diameter part 234 provided at the free end and the length of the free end direction of the concerned two terminals 230 are longer than the other terminals 230. Because of that, with the modification shown in FIG. 6, it becomes easier to set the angle of the support member 220 when inserting each terminal 230 of the terminal unit 200 in the terminal contact part, and it is possible to improve the workability of attaching the terminal unit 200 to the fuel cell 100.

When the length of the free end direction of the two terminals 230 is longer than the other terminals 230, having the two terminals 230 positioned furthest to the outside is most preferable in terms of improved workability, but it is also possible to obtain the effect of a certain degree of workability improvement when the length of any two terminals 230 is made longer.

Figure 7:
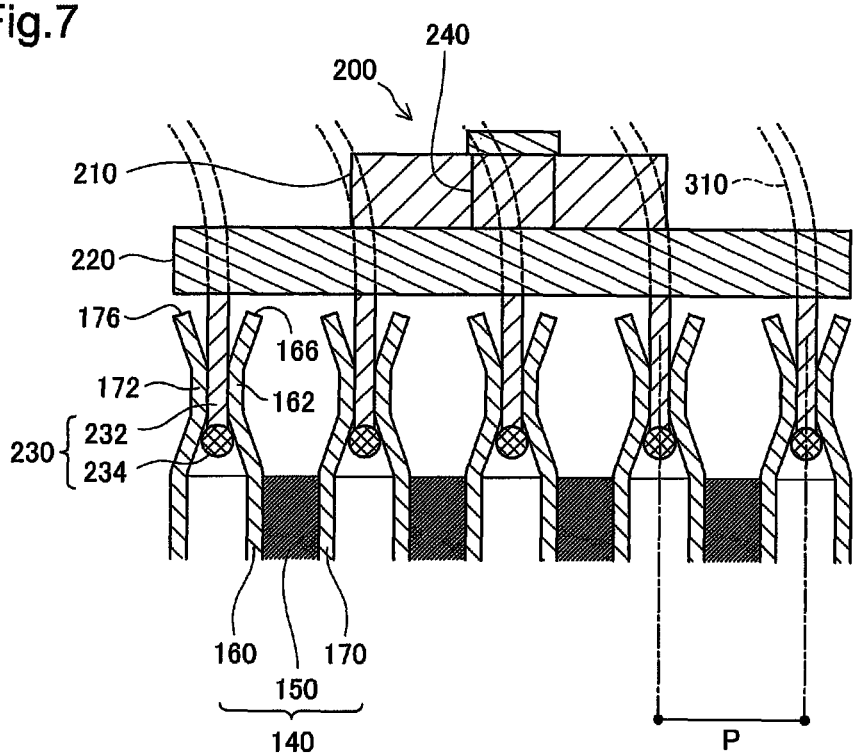
FIG. 7 is an explanatory drawing showing the connected state of the terminal unit 200 and each cell 140 with another modification.

FIG. 7 is an explanatory drawing showing the connected state of the terminal unit 200 and each cell 140 with another modification. With the modification shown in FIG. 7, each cell 140 of the fuel cell has an anode side tapered part 176 and cathode side tapered part 166 formed so as to have the mutual intervals be broader further to the outside at the outermost periphery part of the anode side contact plane part 172 and the cathode side contact plane part 162 constituting the terminal contact part. Because of this, with the modification in FIG. 7, it is possible to easily insert each terminal 230 of the terminal unit 200 to the terminal contact part, and it is possible to improve the attachment workability of the terminal unit 200 to the fuel cell 100.

Figure 8:
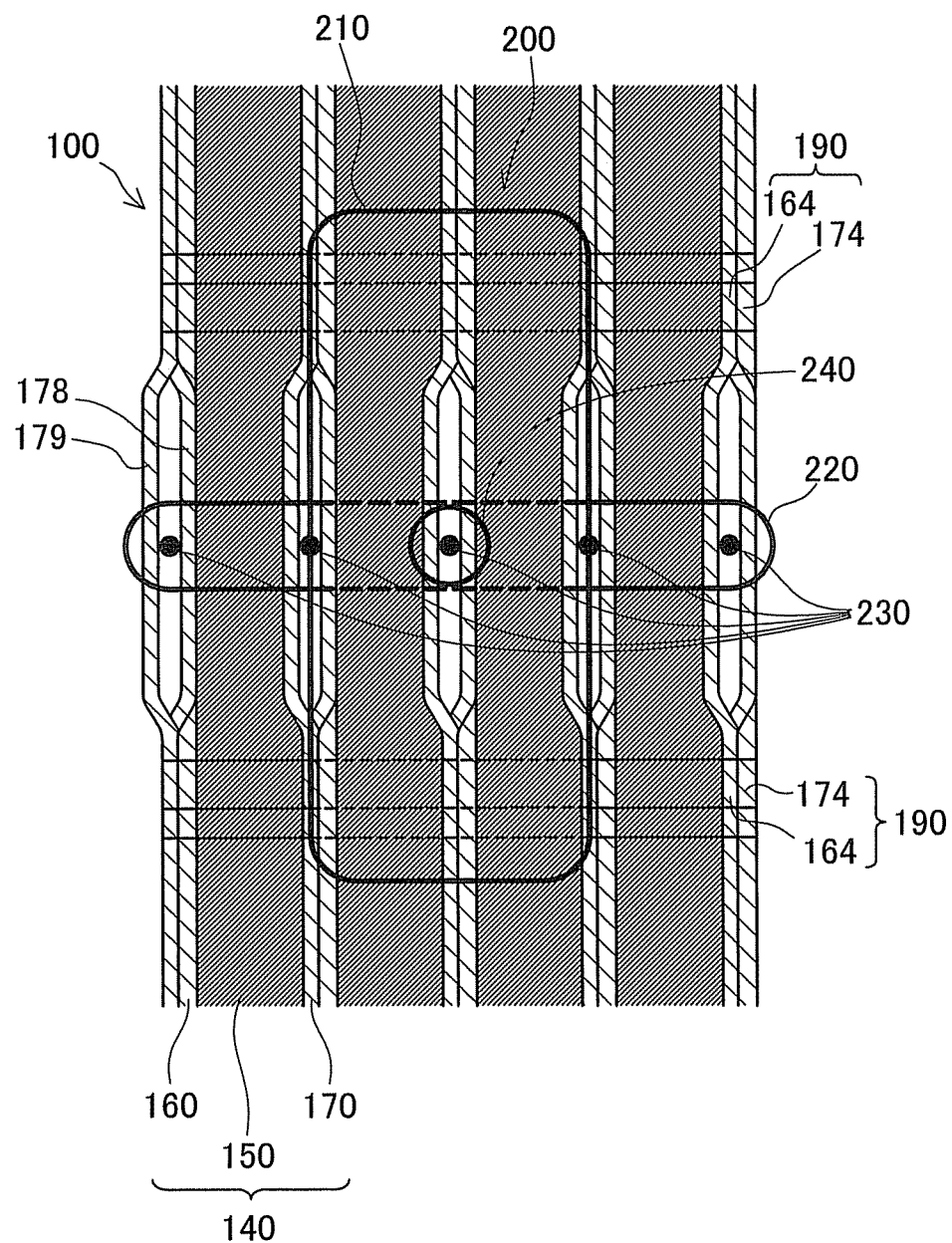
FIG. 8 is an explanatory drawing showing the connected state of the terminal unit 200 and each cell 140 with another modification.

FIG. 8 is an explanatory drawing showing the connected state of the terminal unit 200 and each cell 140 with another modification. With the modification shown in FIG. 8, the terminal contact part of each cell 140 is constituted by an anode side first contact plate part 178 and an anode side second contact part plate 179 formed on the anode side separator 170. The mutual intervals along the stacking direction of the anode side first contact plate part 178 and the anode side second contact plate part 179 is either slightly smaller than the diameter of the columnar part 232 of the terminal 230 or is roughly equal to the diameter of the columnar part 232, the same as with the embodiment described above. Even when arranged in this way, by attaching the terminal unit 200 to the fuel cell 100, it is possible to electrically connect each terminal 230 to each cell 140.

With the embodiment noted above, the terminal unit 200 has five terminals 230, but when the terminal 200 has a plurality of terminals 230, this is not limited to five. With the embodiment noted above, the cross section shape orthogonal to the center axis of the columnar part 232 of each terminal 230 is circular, but the cross section shape of the columnar part 232 can be non-circular as long as at least a specified portion of the periphery of the cross section is an arc shape. Note that the aforementioned specified portion is within a scope for which within the periphery of the cross section of the columnar part 232, through the entire range of the cell thickness of the fuel cell subject to attachment of the terminal unit 200, it is possible to have contact of each cell with the terminal contact part when the terminal unit 200 is attached to the fuel cell.

With the embodiment noted above, the large diameter part 234 of the terminal 230 is a spherical shape, but it does not necessarily have to be a spherical shape as long as it is a shape for which the diameter of the cross section orthogonal to the center axis of the columnar part 232 is a larger shape than the columnar part 232. The terminal 230 may be constituted without having a large diameter part 234, having only a columnar part 232.

With the embodiment noted above, the rotation shaft of the support member 220 with the fixing member 210 matches the center axis of the columnar part 232 of the terminal 230 positioned at the middle among the five terminals 230, but the rotation shaft may also be set to another position as long as it is parallel to the center axis of the columnar part 232 of each terminal 230. However, if the rotation shaft is set so as to be positioned at an equal distance from the center axis of the two terminals 230 positioned furthest outside among the plurality of terminals 230, the maximum degree of variation of the position along the direction orthogonal to the stacking direction of the terminal 230 accompanying rotation of the support member 220 is smaller, and this is desirable because it is possible to minimize the width L of the terminal contact part of the cell 140.

The modes of attaching the fixing member 210 of the terminal unit 200 to the fuel cell 100 with the embodiment noted above is nothing more than an example, and it is possible to use other attachment modes. For example, it is also possible to attach the fixing member 210 by adhesion in a fixed manner to the fuel cell 100. However, when the fixing member 210 is attached to the fuel cell 100 so as to be able to be detached as with the embodiment noted above, it is possible to improve the ease of repair and replacement.

With embodiment noted above, the terminal contact part of the cell 140 is constituted by a set of the anode side contact plate part 172 and the cathode side contact plate part 162, but it is also possible to constitute this from other parts as long as the terminal contact part of the cell 140 has a contact plane orthogonal to the stacking direction of the fuel cell 100 which can detect the electric potential of the cell 140.

With the embodiment noted above, the fuel cell 100 is a polymer electrolyte fuel cell, but it is also possible to apply the present invention to a terminal device for cell voltage measuring with a type of fuel cell other than the polymer electrolyte fuel cell as the subject.

The invention claimed is:

1. A terminal device for cell voltage measurement of a fuel cell having a plurality of cells, the terminal device comprising:
   a plurality of terminals each including a conductive columnar part, the terminals being electrically connected to the cells by the columnar parts, and each of the terminals being in contact with a conductive terminal contact part of a different cell of the fuel cell;
   a support member that supports the terminals so that center axes of the columnar parts of the terminals are parallel to each other, and so that the center axes are aligned in one row at a fixed interval; and
   a fixing member that supports the support member so as to be able to rotate around a specified rotation shaft that is parallel to the center axes, the fixing member being attached to the fuel cell.

2. The terminal device in accordance with claim 1, wherein at least a portion of a periphery of each of the columnar parts in a cross section orthogonal to the center axis is an arc shape.

3. The terminal device in accordance with claim 1, wherein each of the terminals includes at an end part on a side opposite to a side supported by the support member a large diameter part, a diameter of the large diameter part in a cross section orthogonal to the center axis being larger than a diameter of the columnar part in a cross section orthogonal to the center axis.

4. The terminal device in accordance with claim 1, wherein length of two of the terminals among the plurality of terminals along a direction toward a side opposite to a side supported by the support member is longer than the other terminals.

5. The terminal device in accordance with claim 1, wherein the terminal contact part of each of the cells of the fuel cell has a contact plane orthogonal to a stacking direction of the fuel cell, and
   each of the terminals is electrically connected to the cell by contact of a side surface of the columnar part with the contact plane of the terminal contact part.

6. The terminal device in accordance with claim 5, wherein the terminal contact part is constituted by one set of separators of each of the cells of the fuel cell, and
   the terminal contact part has a tapered part constituted by the one set of separators which tapers inwardly in a direction towards the contact part.

7. The terminal device in accordance with claim 5, wherein the rotation shaft is positioned at an equal distance from the center axes of the two terminals positioned furthest to the outside among the plurality of terminals.

8. A fuel cell comprising:
   a plurality of cells; and
   a terminal device for cell voltage measurement of the cells, wherein the terminal device includes:
   a plurality of terminals each including a conductive columnar part, the terminals being electrically connected to the cells by the columnar parts, and each of the terminals being in contact with a conductive terminal contact part of a different cell of the fuel cell;
   a support member that supports the terminals so that center axes of the columnar parts of the terminals are parallel to each other, and so that the center axes are aligned in one row at a fixed interval; and
   a fixing member that supports the support member so as to be able to rotate around a specified rotation shaft that is parallel to the center axes, the fixing member being attached to the fuel cell.

* * * * *